(12) United States Patent
Miyahara et al.

(10) Patent No.: US 9,136,372 B2
(45) Date of Patent: Sep. 15, 2015

(54) SILICON CARBIDE SEMICONDUCTOR DEVICE

(75) Inventors: Shinichiro Miyahara, Nisshin (JP); Masahiro Sugimoto, Toyota (JP); Hidefumi Takaya, Miyoshi (JP); Yukihiko Watanabe, Nagoya (JP); Narumasa Soejima, Seto (JP); Tsuyoshi Ishikawa, Nisshin (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 332 days.

(21) Appl. No.: 13/531,793

(22) Filed: Jun. 25, 2012

(65) Prior Publication Data

US 2013/0001592 A1 Jan. 3, 2013

(30) Foreign Application Priority Data

Jun. 29, 2011 (JP) ................................. 2011-144320

(51) Int. Cl.
*H01L 29/66* (2006.01)
*H01L 29/78* (2006.01)
*H01L 29/423* (2006.01)
*H01L 29/04* (2006.01)
*H01L 29/08* (2006.01)
(Continued)

(52) U.S. Cl.
CPC .......... *H01L 29/7813* (2013.01); *H01L 29/045* (2013.01); *H01L 29/0865* (2013.01); *H01L 29/4236* (2013.01); *H01L 29/66068* (2013.01); H01L 29/1095 (2013.01); H01L 29/1608 (2013.01); H01L 29/7825 (2013.01); H01L 29/7827 (2013.01)

(58) Field of Classification Search
CPC ............ H01L 29/1608; H01L 29/7801; H01L 29/7827; H01L 29/66674; H01L 29/66712; H01L 29/7825
USPC ............ 257/77, 328–330, E29.255–E29.257, 257/E29.26, E29.262; 438/138
See application file for complete search history.

(56) References Cited

U.S. PATENT DOCUMENTS

| | | | |
|---|---|---|---|
| 5,744,826 A | | 4/1998 | Takeuchi et al. |
| 6,049,108 A | * | 4/2000 | Williams et al. .............. 257/341 |

(Continued)

FOREIGN PATENT DOCUMENTS

| | | |
|---|---|---|
| JP | 09-260650 A | 10/1997 |
| JP | 2009-188221 A | 8/2009 |

OTHER PUBLICATIONS

U.S. Appl. No. 13/348,781, filed Jan. 12, 2012, Miyahara et al.
(Continued)

*Primary Examiner* — Kenneth Parker
*Assistant Examiner* — John Lin
(74) *Attorney, Agent, or Firm* — Posz Law Group, PLC

(57) ABSTRACT

In a silicon carbide semiconductor device, a plurality of trenches has a longitudinal direction in one direction and is arranged in a stripe pattern. Each of the trenches has first and second sidewalls extending in the longitudinal direction. The first sidewall is at a first acute angle to one of a (11-20) plane and a (1-100) plane, the second sidewall is at a second acute angle to the one of the (11-20) plane and the (1-100) plane, and the first acute angle is smaller than the second acute angle. A first conductivity type region is in contact with only the first sidewall in the first and second sidewalls of each of the trenches, and a current path is formed on only the first sidewall in the first and second sidewalls.

1 Claim, 4 Drawing Sheets

(51) Int. Cl.
*H01L 29/10* (2006.01)
*H01L 29/16* (2006.01)

(56) References Cited

U.S. PATENT DOCUMENTS

| | | | |
|---|---|---|---|
| 8,384,151 B2* | 2/2013 | Pfirsch | 257/328 |
| 8,395,162 B2* | 3/2013 | Nakano et al. | 257/77 |
| 2005/0045960 A1 | 3/2005 | Takahashi | |
| 2005/0139909 A1 | 6/2005 | Miura | |
| 2006/0108634 A1 | 5/2006 | Miura | |
| 2007/0114602 A1 | 5/2007 | Saito et al. | |
| 2009/0280609 A1 | 11/2009 | Akiba et al. | |
| 2011/0017998 A1 | 1/2011 | Nakano et al. | |

OTHER PUBLICATIONS

Office Action mailed Aug. 19, 2014 issued in corresponding JP patent application No. 2011-144320 (and English translation).
Office Action mailed on Jul. 3, 2014 in the corresponding CN application No. 201210226273.9 (with English translation).
Office Action mailed Jan. 14, 2015 issued in corresponding CN patent application No. 201210226273.9 (and English translation).

* cited by examiner

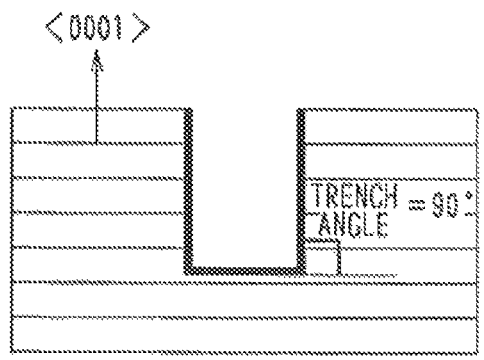 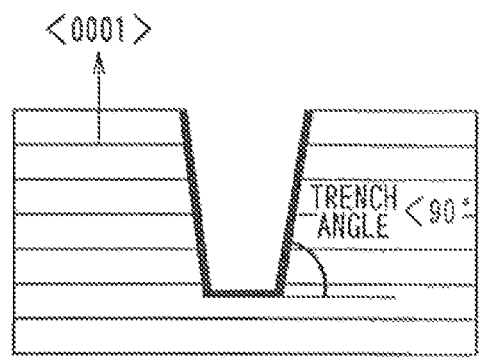
FIG. 6A RELATED ART
FIG. 6B RELATED ART

SILICON CARBIDE SEMICONDUCTOR DEVICE

CROSS REFERENCE TO RELATED APPLICATIONS

The present application is based on and claims priority to Japanese Patent Application No. 2011-144320 filed on Jun. 29, 2011, the contents of which are incorporated in their entirety herein by reference.

TECHNICAL FIELD

The present disclosure relates to a silicon carbide (SIC) semiconductor device including a trench gate.

BACKGROUND

A conventional SIC semiconductor device includes a metal-oxide semiconductor field-effect transistor (MOSFET) having a trench gate structure, which can increase a channel density, so that a large current can flow in the SIC semiconductor device. In the MOSFET made of SIC, electrical characteristics drastically change with a plane direction of a plane on which a channel is formed. Especially, an angle of a trench formed by etching influences a plane direction and electronic characteristics. Thus, an angle of a trench is important in a MOSFET having a trench gate structure. Ideally, it is preferred that a trench sidewall on which a channel is formed is close to a (11-20) plane or a (1-100) plane, that is, a plane perpendicular to a (0001) plane or (000-1) plane, which can increase a channel mobility (see JP-A-H9-199724, which corresponds to U.S. Pat. No. 5,744,826).

Etching vertically with high accuracy is necessary in order that the trench sidewall is the (11-20) plane or the (1-100) plane, which can increase a channel mobility. It is known that SIC is generally dry-etched by reactive ion etching (RIE) or inductively coupled plasma (ICP) using $SF_6$, $Cl_2$, $CF_4$ as etching gas. Ideally, it is preferred that a trench etching is performed vertically from a wafer surface.

However, because SIC is chemically stable substance, it is difficult to etch SIC vertically with high accuracy. Although it is ideal that an angle of a trench sidewall is vertical to the (0001) plane of a wafer surface as shown in FIG. 6A, actually, a trench sidewall inclines with respect to a plane perpendicular to the (0001) plane as shown in FIG. 6B.

Thus, the trench sidewall inclines with respect to the (11-20) plane or the (1-100) plane, which can increase the channel mobility, and a high channel mobility may not be obtained. When an inclination angle of the trench sidewall with respect to the (11-20) plane or the (1-100) plane is small, a decrease in the channel mobility is small. However, when the inclination angle is greater than a predetermined value, the channel mobility decreases, and a desired channel mobility may not be obtained.

SUMMARY

It is an object of the present disclosure to provide a SIC semiconductor device in which a trench sidewall is close to a (11-20) plane or (1-100) plane and a channel mobility can be increased.

A SIC semiconductor device according to an aspect of the present disclosure includes a semiconductor substrate, a base region, a plurality of trenches, a first conductivity type region, a contact layer, a gate insulating layer, a gate electrode, a first electrode, and a second electrode.

The semiconductor substrate includes a SiC substrate and a drift layer disposed on the SiC substrate. The SIC substrate has one of a first conductivity type and a second conductivity type. The drift layer is made of silicon carbide and has the first conductivity type. The semiconductor substrate is an off substrate whose surface has an off angle.

The base region is disposed on the drift layer. The base region is made of silicon carbide and has the second conductivity type. The trenches penetrate the base region from a surface of the base region into the drift layer. The trenches have a longitudinal direction in one direction and are arranged in a stripe pattern. Each of the trenches has first and second sidewalls extending in the longitudinal direction. The first conductivity type region is in contact with only the first sidewall in the first and second sidewalls of each of the trenches. The first conductivity type region has a higher impurity concentration than the drift layer. The contact layer is disposed on an opposite side of the first conductivity type region from each of the trenches. The contact layer has the second conductivity type and has a higher impurity concentration than the base region. The gate insulating layer is disposed in each of the trenches. The gate electrode is disposed in each of the trenches via the gate insulating layer. The first electrode is electrically coupled with the first conductivity type region and the contact layer. The second electrode is electrically coupled with the silicon carbide substrate.

When the gate electrode is applied with a gate voltage, a current path is formed on only the first sidewall in the first and second sidewalls of each of the trenches and electric current flows in the current path.

The surface of the semiconductor substrate has the off angle with respect to one of a (0001) plane and a (000-1) plane.

The semiconductor substrate has an off direction in a <11-20> direction and the longitudinal direction of the trenches is a <1-100> direction that is perpendicular to the off direction, or the semiconductor substrate has an off direction in a <1-100> direction and the longitudinal direction of the trenches is a <11-20> direction that is perpendicular to the off direction.

The first sidewall is at a first acute angle to one of a (11-20) plane and a (1-100) plane, the second sidewall is at a second acute angle to the one of the (11-20) plane and the (1-100) plane, and the first acute angle is smaller than the second acute angle.

In the above-described SiC semiconductor device, the channel is formed only the first sidewall having a smaller acute angle to one of a (11-20) plane and the (1-100) plane than the second sidewall. Thus, silicon carbide semiconductor device can have a high channel mobility.

BRIEF DESCRIPTION OF THE DRAWINGS

Additional objects and advantages of the present disclosure will be more readily apparent from the following detailed description when taken together with the accompanying drawings. In the drawings:

FIG. 6A is a diagram showing an ideal trench etching and FIG. 6B is a diagram showing an actual trench etching.

DETAILED DESCRIPTION

Figure 1:
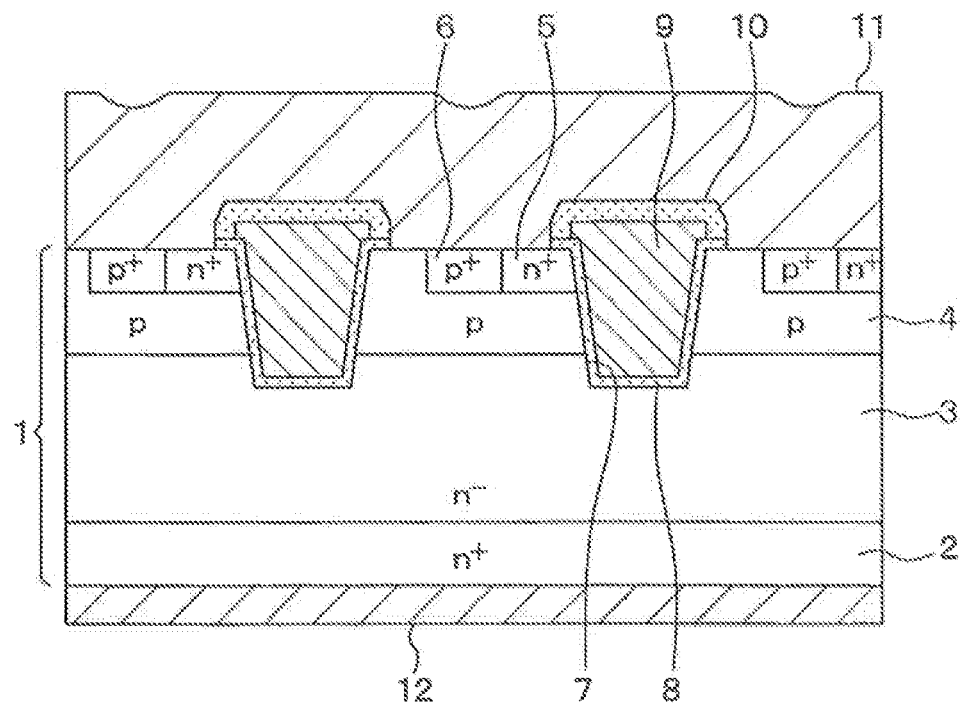
FIG. 1 is a cross-sectional view of a SIC semiconductor device including a vertical MOSFET having a trench gate structure according to a first embodiment of the present disclosure.

Embodiments of the present disclosure will be described with reference to drawings. In each of the following embodiments, the same reference numeral is given to the same or equivalent parts in the drawings.

(First Embodiment)

Figure 2:
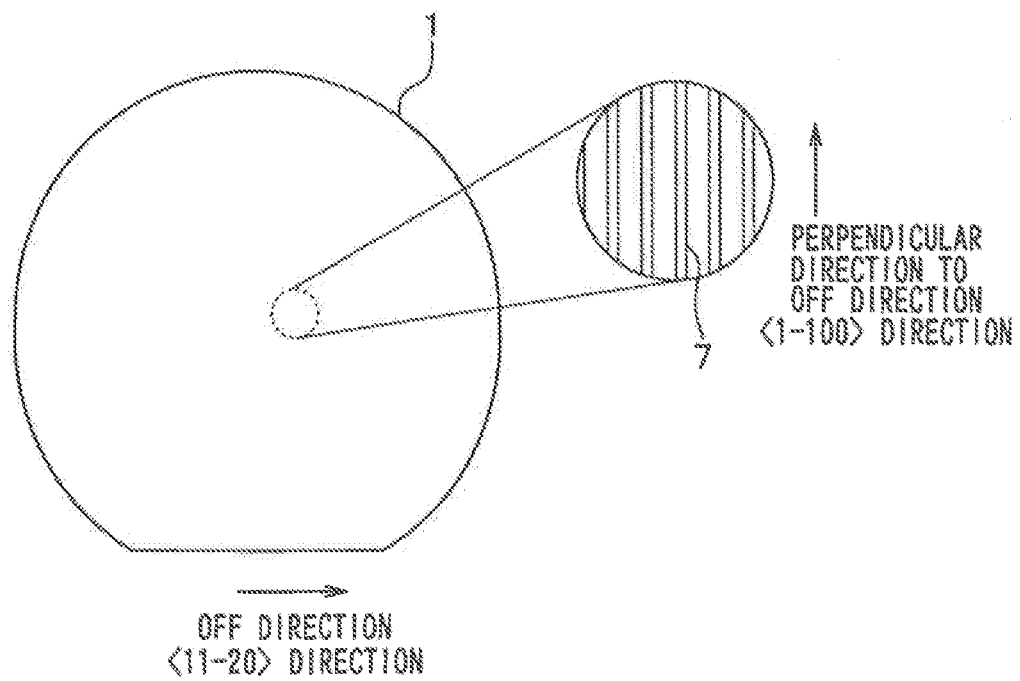
FIG. 2 is a plane view of a wafer including the SiC semiconductor device shown in FIG. 1.

A SiC semiconductor device according to a first embodiment of the present disclosure will be described with reference to FIG. 1 and FIG. 2. The SiC semiconductor device includes vertical MOSFETs having trench gate structure. In FIG. 1, only two cells of the vertical MOSFETs are shown. However, multiple MOSFETs having structure similar to the vertical MOSFETs shown in FIG. 1 are arranged so as to be adjacent to each other. FIG. 2 is a plan view of a wafer in which a device structure of the SiC semiconductor device shown in FIG. 1 is formed and shows a state before cut into chips.

The SiC semiconductor device shown in FIG. 1 includes a SiC semiconductor substrate 1. The SIC semiconductor substrate 1 is an off substrate having an off angle of 4 degrees with respect to a (0001) plane. As shown in FIG. 2, an off direction of the off substrate is parallel to a <11-20> direction.

As shown in FIG. 1, the SiC semiconductor substrate 1 includes an n$^+$-type SiC substrate 2, which is an off substrate, and an n$^-$-type drift layer 3 epitaxially formed on a surface of the n$^+$-type SIC substrate 2. The n$^+$-type SIC substrate 2 and the n$^-$-type drift layer 3 include n-type impurities, such as phosphorus, and an n-type impurity concentration of the n$^-$-type drift layer 3 is lower than an n-type impurity concentration of the n$^+$-type SIC substrate 2.

The n$^+$-type SIC substrate 2 may have an n-type impurity concentration of, for example, $1.0 \times 10^{19}/cm^3$ and may have a thickness of about 300 µm. The n$^-$-type drift layer 3 may have an n-type impurity concentration of $3.0 \times 10^{15}/cm^3$ to $7.0 \times 10^{15}/cm^3$ and may have a thickness of about 10 µm to 15 µm. Although the impurity concentration of the n$^-$-type drift layer 3 may be constant in a depth direction, it is preferred that the concentration is changed in such a manner that a portion of the n$^-$-type drift layer 3 adjacent to the n$^+$-type SIC substrate 2 has a higher concentration than a portion of the n$^-$-type drift layer 3 being far from the n$^+$-type SIC substrate 2. For example, the impurity concentration of a portion of the n$^-$-type drift layer 3 at a distance between about 3 µm and about 5 µm from the surface of the n$^+$-type SIC substrate 2 may be higher than the impurity concentration of the other portion of the n$^-$-type drift layer 3 by about $2.0 \times 10^{15}/cm^{-3}$. Accordingly, an internal resistance of the n$^-$-type drift layer 3 can be reduced and an on-resistance can be reduced.

In a surface portion of the n"-type drift layer 3, a p-type base region 4 is formed. In an upper portion of the p-type base region 4, an n$^+$-type source region 5 and a p$^+$-type body layer 6 are disposed. The n$^+$-type source region 5 can operate as a first conductivity type region. The p$^+$-type body layer 6 can operate as a contact layer.

The p-type base region 4 and the p$^+$-type body layer 6 include p-type impurities, such as boron and aluminum. The n$^+$-type source region 5 includes n-type impurities, such as phosphorus. The p-type base region 4 may have a p-type impurity concentration of, for example, $5.0 \times 10^{16}/cm^3$ to $2.0 \times 10^{19}/cm^3$ and may have a thickness of about 2.0 µm, The n$^+$-type source region 5 may have an n-type impurity concentration (surface concentration) of, for example, $1.0 \times 10^{21}/cm^3$ and may have a thickness of about 0.3 atm. The p$^+$-type body layer 6 may have a p-type impurity concentration of, for example, $1.0 \times 10^{21}/cm^3$ and may have a thickness of about 0.3 µm. The n$^+$-type source region 5 is disposed on only one side of a trench gate structure. The p$^+$-type body layer 6 is disposed on an opposite side of the n$^+$-type source region 5 from the trench gate structure. On a side of the trench gate structure different from the side on which the n$^+$-type source region 5 is disposed, the p$^+$-type body layer 6 is apart from the trench gate structure.

A plurality of trenches 7 penetrates the p-type base region 4 and the n$^+$-type source region 5 into the n$^-$-type drift layer 3. Each trench 7 may have a width of, for example, 1.4 µm to 2.0 µm and may have a depth of greater than or equal to 2.0 µm (e.g., 2.5 µm). The trenches 7 extend in a <1-100> direction that is perpendicular to the off direction and arranged at regular intervals into a stripe pattern. Hereafter, the direction in which the trenches 7 extend is referred to as a longitudinal direction of the trench gate structure. Each trench 7 has a first sidewall and a second sidewall extending in the longitudinal direction. In the example shown in FIG. 1, the first sidewall corresponds to a left sidewall and the second sidewall corresponds to a right sidewall.

The p-type base region 4 is in contact with the first sidewall and the second sidewall of each trench 7. The n$^+$-type source region 5 is in contact with only the first sidewall in the first and second sidewalls of each trench 7 and the n$^+$-type source region 5 is not provided on the second sidewall of each trench 7. It is ideal that the sidewalls of each trench 7 are vertical to the surface of the SIC semiconductor substrate 1. However, it is difficult to form each trench 7 vertically, and actually, the sidewalls of the trenches 7 incline. In the present embodiment, an angle between the first sidewall of each trench 7 and a plane parallel to the surface of the SiC semiconductor substrate 1 is within a range from 82 degrees to 90 degrees.

A surface of each trench 7 is covered by a gate oxide layer 8, and each trench 7 is fined with a gate electrode 9 formed on a surface of the gate oxide layer 8 and made of doped polysilicon. In other words, the gate oxide layer 8 is disposed in each trench 7, and the gate electrode 9 is disposed in each trench 7 via the gate oxide layer 8. The gate oxide layer 8 is formed by thermally oxidizing the surfaces of the trenches 7. A thickness of the gate oxide layer 8 is about 10 nm both on the sidewalls and bottoms of each trench 7. The trench gate structure has the above-described configuration. The n$^+$-type source region 5 and the p$^+$-type body layer 6 extend along the longitudinal direction of the trench gate structure that is arranged in a stripe pattern. A channel is formed on the first sidewall of each trench 7 with which the n$^+$-type source region 5 is in contact, and a channel is not formed on the second sidewall of each trench 7.

On surfaces of the n$^+$-type source region 5 and the p$^+$-type body layer 6 and a surface of the gate electrode 9, a source electrode (first electrode) 11 and a gate wiring (not shown) are disposed via an interlayer insulating layer 10. The source electrode 11 and the gate wiring are made of a plurality of metals, for example, a dual-layer of nickel and aluminum. At least portions of the source electrode 11 and the gate wiring being in contact with an n-type SIC are made of a metal that can provide an ohmic contact between each of the source electrode 11 and the gate wiring and the n-type SiC. The n-type SIC includes the $n^+$-type source region 5 and the gate electrode 9 if the gate electrode 9 includes n-type impurities. At least portions of the source electrode 11 and the gate wiring being in contact with a p-type SiC are made of a metal that can provide an ohmic contact between each of the source electrode 11 and the gate wiring and the p-type SIC. The p-type SIC includes the $p^+$-type body layer 6 and the gate electrode 9 if the gate electrode 9 includes p-type impurities. The source electrode 11 and the gate wiring are electrically insulated by being formed on an interlayer insulating layer 10. Through contact holes provided in the interlayer insulating layer 10, the source electrode 11 is electrically coupled with the $n^+$-type source region 5 and the $p^+$-type body layer 6, and the gate wiring is electrically coupled with the gate electrode 9.

On a rear surface side of the $n^+$-type SiC substrate 2, a drain electrode 12 electrically coupled with the $n^+$-type SIC substrate 2 is disposed. The drain electrode 12 can operate as a second electrode. Accordingly, the SiC semiconductor device including the MOSFET having the n channel inversion-type trench gate structure is formed.

In the SIC semiconductor device having the above-described configuration, when the gate electrode 9 is applied with a gate voltage, the channel is formed on the both sidewalls of each trench 7, but one channel formed on one sidewall doesn't contact the source region 5, so that electric current flows in another channel. In this way, only the first sidewall in the first and second sidewalls of each trench 7 becomes a current path. This is because the SIC semiconductor substrate 1 is the off-substrate and plane directions of the first sidewall and the second sidewall of each trench 7 are different from each other. This will be described with reference to FIG. 3.

Figure 3:
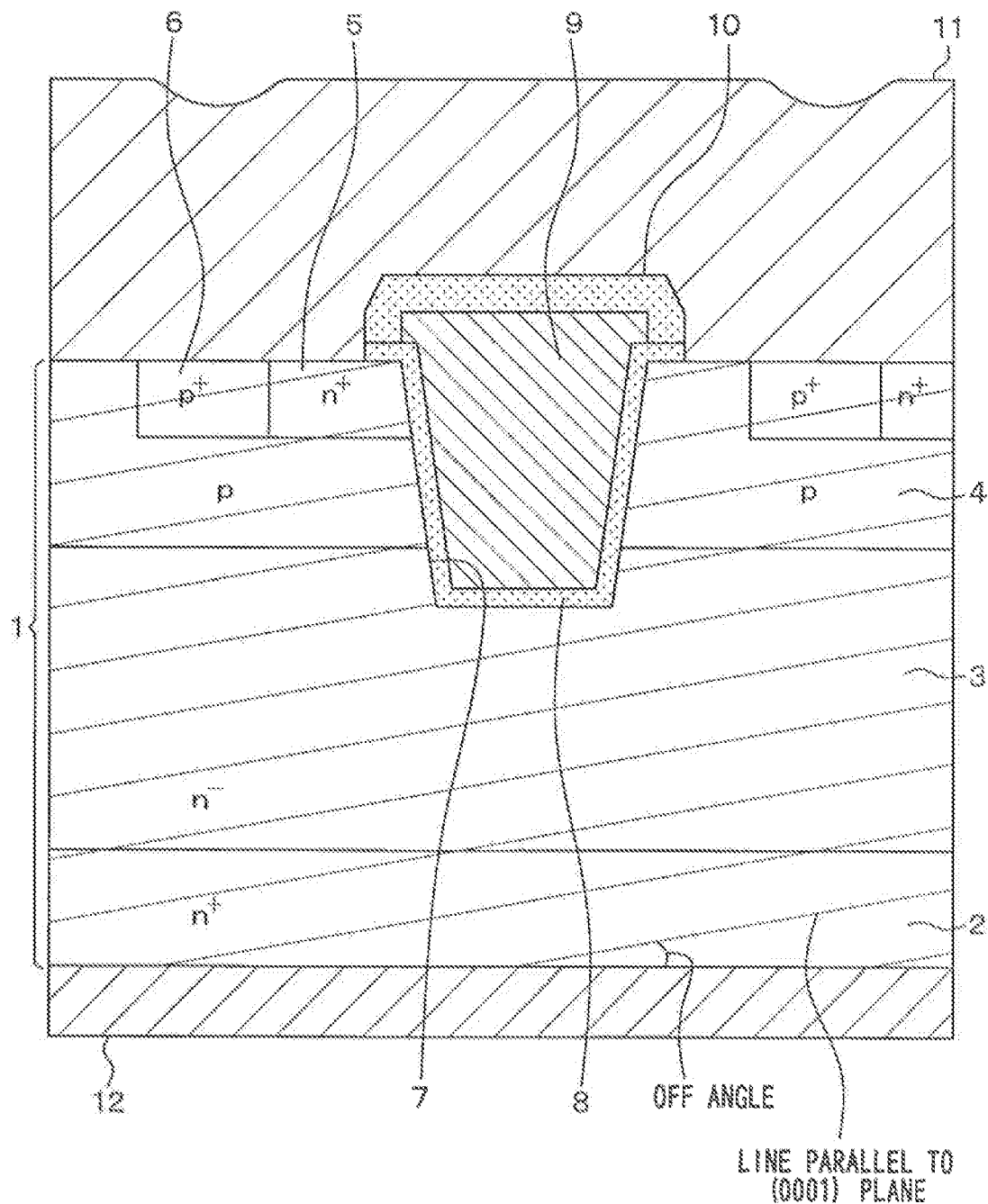
FIG. 3 is a diagram in which lines parallel to a (0001) plane are illustrated in a cross section of the SiC semiconductor device.

In FIG. 3, lines parallel to the (0001) plane are illustrated in a cross section of the SiC semiconductor device. As shown in FIG. 2, the SiC semiconductor substrate 1 is the off-substrate having the off angle. Since the first sidewall and the second sidewall of each trench 7 incline with respect to the surface of the SiC semiconductor substrate 1, an angle between the first sidewall and the (0001) plane is different from an angle between the second sidewall and the (0001) plane.

Specifically, the angle between first sidewall of each trench 7 and the (0001) plane is 90 degrees or an angle close to 90 degrees due to the off angle, and the angle between the second sidewall of each trench 7 and the (0001) plane is an angle far from 90 degrees due to the off angle. The plane that is perpendicular to the (0001) plane is a (11-20) plane on which the channel mobility is the highest, and the channel mobility increases as the plane approaches the (11-20) plane. Thus, on the first sidewall of each trench 7 having the angle of 90 degrees or the angle close to 90 degrees with respect to the (0001) plane, a high channel mobility can be obtained. On the other hand, on the second sidewall of each trench 7 having the angle far from 90 degrees with respect to the (0001) plane, a high channel mobility may not be obtained.

Thus, in the present embodiment, the $n^+$-type source region 5 is formed on the first sidewall of each trench 7 so that the current path is formed on only the first sidewall of each trench 7. The first sidewall is at a first acute angle to the (11-20) plane and the second sidewall is at a second acute angle to the (11-20) plane, and the first acute angle is smaller than the second acute angle. In other words, the first sidewall of each trench 7 whose acute angle with respect to the (11-20) plane is smaller than the second sidewall is set to the current path. Accordingly, the current path is formed only on the sidewall having a high channel mobility, and the high channel mobility can be obtained.

In cases where the current path is formed both the first sidewall and the second sidewall of each trench 7, the channel mobility differs between the first sidewall and the second sidewall, and electric current that flows on the first sidewall and the second sidewall becomes imbalanced. However, in cases where the current path is formed only the first sidewall of each trench 7, imbalanced electric current does not flow on the both sidewalls of each trench 7, the SIC semiconductor device can operate stably.

In a manufacturing method of the SiC semiconductor device according to the present embodiment, the off substrate having the off direction in the <11-20> direction is used as the semiconductor substrate 1, the longitudinal direction of the trenches 7 is set to the <1-100> direction that is perpendicular to the off direction, and masks for implanting ions to form the $n^+$-type source region 5 and the $p^+$-type body layer 6 are changed from the conventional masks. The other part of the manufacturing method of the SiC semiconductor device may be similar to a manufacturing method of a conventional SIC semiconductor device.

In the manufacturing method of the SIC semiconductor device according to the present embodiment, because the current path is formed on only the first sidewall of each trench 7, following effects can be obtained. Each trench 7 is formed by dry etching, such as RIE and CIP, using $SF_5$, $Cl_2$, and $CF_4$ as etching gas, and it is difficult to form each trench 7 by etching such that the sidewalls of each trench 7 are vertical to the surface of the SiC semiconductor substrate 1. However, in the case where the current path is formed only one sidewall of each trench 7 as the present embodiment, only the sidewall on which the current path is formed has to be close to vertical with respect to the (0001) plane. Even if the sidewall inclines with respect to a plane vertical to the surface of the SiC semiconductor substrate 1, the sidewall can be close to vertical with respect to the (0001) plane.

Thus, without setting etching conditions strictly, the one sidewall of each trench 7 on which the channel is formed can be close to vertical with respect to the (0001) plane even if the one sidewall of each trench 7 is not vertical with respect to the surface of the SIC semiconductor substrate 1. According to an examination, the channel mobility becomes the highest on the (1-100) plane and the (11-20) plane vertical to the (1-100) plane, the channel mobility is also high when the sidewall inclines slightly, and a high channel mobility can be obtained when the angle with respect to the (0001) plane is greater than or equal to 86 degrees. Furthermore, even when the angle of the sidewall of each trench 7 with respect to the (0001) plane is greater than 90 degrees, a high channel mobility can be obtained. Because the high channel mobility can be obtained over a wide angle range, a process margin at etching for forming the trenches 7 can be expanded.

As described above, when the angle with respect to the (0001) plane is greater than or equal to 86 degrees, a high channel mobility can be obtained. In cases where the SIC semiconductor substrate 1 is used as the off substrate, the sidewalls of each trench 7 may further incline by the off angle with respect to the surface of the SIC semiconductor substrate 1. The SiC semiconductor substrate 1 has the off angle of 4 degrees with respect to the (0001) plane. Thus, in the present embodiment, the angle between the first sidewall of each trench 7 and a plane parallel to the surface of the SiC semiconductor substrate 1 may be within a range from 82 degrees to 90 degrees.

(Second Embodiment)

A SiC semiconductor device according to a second embodiment of the present disclosure will be described with reference to FIG. 4. In the SiC semiconductor device according to the present embodiment, miniaturization in an off direction is performed with respect to the SiC semiconductor device according to the first embodiment, and the other part is similar to the first embodiment. Thus, only a part different from the first embodiment will be described.

Figure 4:
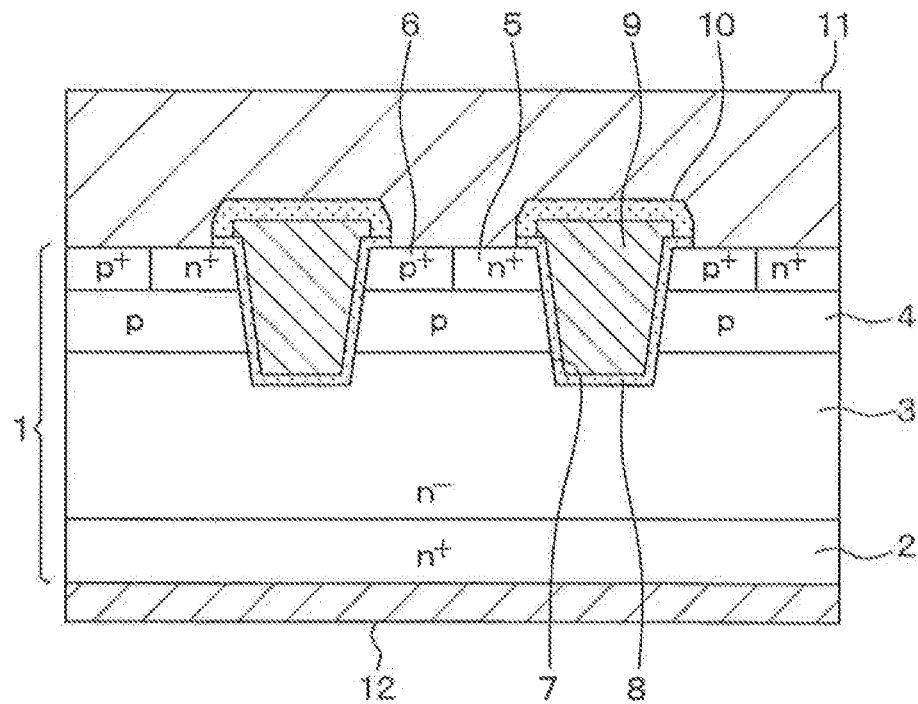
FIG. 4 is a cross-sectional view of a SIC semiconductor device including a vertical MOSFET having a trench gate structure according to a second embodiment of the present disclosure.

As shown in FIG. 4, the SiC semiconductor device according to the present embodiment includes a vertical MOSFET having a trench gate structure. In the SiC semiconductor device, the $p^+$-type body layer 6 is in contact with the second sidewall of each trench 7 on which a current path is not formed. In cases where a current path is formed only one sidewall of each trench 7, because the number of current paths per unit area is small compared with cases where current paths are formed on both sidewalls, an on-resistance increases. The increase in on-resistance can be restricted by decreasing a distance between adjacent trenches 7. In cases where the $p^+$-type body layer 6 is in contact with the second sidewall of each trench 7 on which the current path is not formed, the on-resistance can be further restricted.

In cases where the $p^+$-type body layer 6 is formed so as to be in contact with the second sidewall of each trench 7, electric current flows through the $p^+$-type body layer 6 at avalanche breakdown, and the gate oxide layer 8 may be damaged at a contact portion. Thus, in order to improve avalanche breakdown voltage, it is preferred to dispose the $p^+$-type body layer 6 apart from the trench 7.

(Third Embodiment)

A SiC semiconductor device according to a third embodiment of the present disclosure will be described with reference to FIG. 5. In the present embodiment, a breakdown voltage is improved with respect to the SiC semiconductor device according to the second embodiment and the other part is similar to the second embodiment. Thus, only a part different from the second embodiment will be described.

Figure 5:
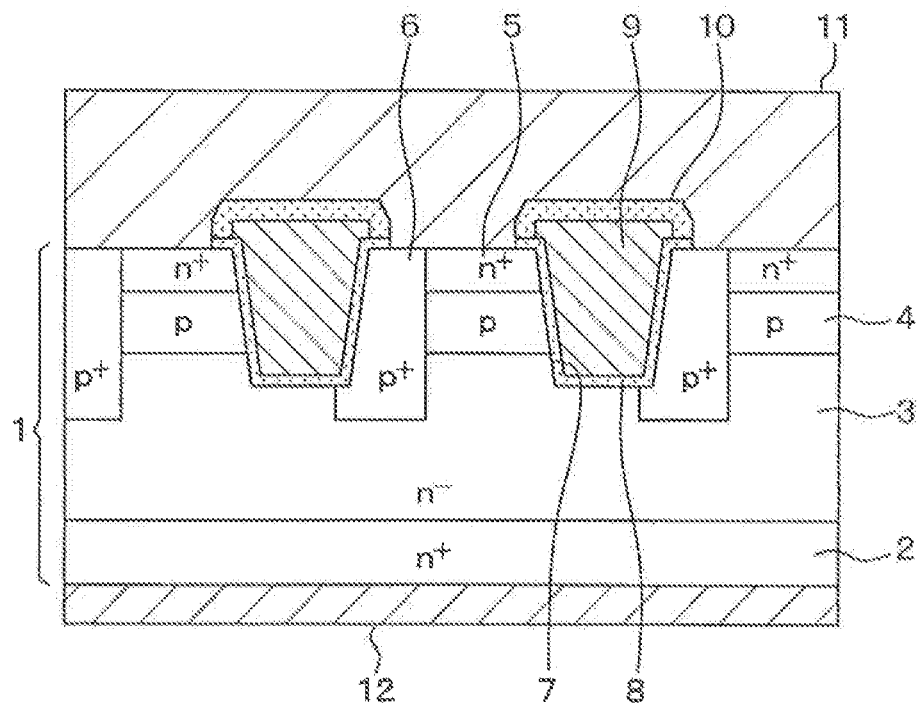
FIG. 5 is a cross-sectional view of a SIC semiconductor device including a vertical MOSFET having a trench gate structure according to a third embodiment of the present disclosure.

As shown in FIG. 5, the SiC semiconductor device according to the present embodiment includes a vertical MOSFET having a trench gate structure. Also in the present embodiment, the $p^+$-type body layer 6 is in contact with the second sidewall of each trench 7 on which a current path is not formed. The $p^+$-type body layer 6 extends to a position deeper than the bottom of each trench 7. The $p^+$-type body layer 6 has an impurity concentration higher than the impurity concentration of the p-type bare region 4. In cases where the $p^+$-type body layer 6 extends to the position deeper than the bottom of each trench 7, a high voltage is less likely to enter the gate oxide layer 8 due to a depletion layer extending from the $p^+$-type body layer 6 to the $n^-$-type drift layer 3 at a reverse bias. Thus, electric field concentration in the gate oxide layer 8 can be relaxed and a damage of the gate oxide layer 8 can be restricted. Accordingly, the breakdown voltage can be improved.

The SiC semiconductor device including the vertical MOSFET having the above-described structure can be formed basically similar to the manufacturing method of the SiC semiconductor device according to the first embodiment. However, the $p^+$-type body layer 6 has to be formed to a deep position. Because SiC is very hard, it is difficult to form the $p^+$-type body layer 6 to the deep position. The $p^+$-type body layer 6 may be formed, for example, as described below. After the p-type base region 4 is formed and before the trenches 7 are formed, depressions are formed at regions where the $p^+$-type body layer 6 is to be formed, and a $p^+$-type layer is epitaxially formed to fill the depressions. Then, the $p^+$-type layer is removed, for example, by chemical mechanical polishing (CMP) until the p-type base region 4 is exposed. Accordingly, the $p^+$-type body layer 6 can be formed to the deep position. In cases where the p-type base region 4 is formed by epitaxial growth, a process of implanting p-type impurities at regions where the $p^+$-type body layer 6 to be formed may be repeated during a process of forming the p-type bare region 4, thereby forming the $p^+$-type body layer 6 in a step-by-step manner.

(Other Embodiments)

In each of the above-described embodiments, the SiC semiconductor substrate 1 is the off substrate having the off angle with respect to the (0001) plane.

The SiC semiconductor substrate 1 may also be an off substrate having an off angle with respect to a (000-1) plane.

In each of the above-described embodiments, the off direction of the SiC semiconductor substrate 1 is the <11-20> direction. The off direction of the SiC semiconductor substrate 1 may also be a <1-100> direction. In this case, the longitudinal direction of the trenches 7 is the <11-20> direction that is perpendicular to the off direction, and a plane direction of a sidewall of each trench 7 on which the channel is formed is set to be close to the (1-100) plane.

In each of the above-described embodiments, the off angle of the SiC semiconductor substrate 1 is 4 degrees. The off angle of the SiC semiconductor substrate 1 may be changed within a range from 2 degrees to 8 degrees. In this case, an angle range of the inclination angle of the sidewalls of the trenches 7 within which a high channel mobility can be obtained changes with the off angle. However, the process margin of the etching for forming the trenches 7 can be expanded in any case.

In each of the above-described embodiment, the n channel type MOSFET in which a first conductivity type is the n-type and a second conductivity type is the p-type is explained as an example. However, the present invention can also be applied to a p channel type MOSFET in which a conductivity type of each components is inverted. In addition, in the above-described explanation, the MOSFET having the trench gate structure is described as an example. The present invention can also be applied to an IGBT having a trench gate structure. In cases where the SiC semiconductor device includes the IGBT, the conductivity type of the $n^+$-type SiC substrate 2 is changed from the n conductivity type to the p conductivity type. Other structure and a manufacturing method are similar to the above-described embodiment.

Although the gate oxide layer 8 formed by thermal oxidation is described as an example of a gate insulating layer, the gate insulating layer may also be an insulating layer other than an oxide layer, such as nitride layer.

When an orientation of a crystal face is described, it is originally required for attaching a bar above a desired figure. However, the bar is attached before the desired figure in the present specification because there are limitations of description in an electronic filing.

What is claimed is:

1. A silicon carbide semiconductor device comprising:
a silicon carbide semiconductor substrate including a silicon carbide substrate and a drift layer disposed on the silicon carbide substrate, the silicon carbide substrate having one of a first conductivity type and a second conductivity type, the drift layer made of silicon carbide and having the first conductivity type, the silicon carbide semiconductor substrate being an off substrate whose surface has an off angle;

a base region disposed on the drift layer, the base region made of silicon carbide and having the second conductivity type;

a plurality of trenches penetrating the base region from a surface of the base region into the drift layer, the trenches having a longitudinal direction in one direction and arranged in a stripe pattern, each of the trenches having first and second sidewalls extending in the longitudinal direction;

a first conductivity type region being in contact with only the first sidewall in the first and second sidewalls of each of the trenches, the first conductivity type region having a higher impurity concentration than the drift layer;

a contact layer disposed on an opposite side of the first conductivity type region from each of the trenches, the contact layer having the second conductivity type and having a higher impurity concentration than the base region;

a gate insulating layer disposed in each of the trenches;

a gate electrode disposed in each of the trenches via the gate insulating layer;

a first electrode electrically coupled with the first conductivity type region and the contact layer; and a second electrode electrically coupled with the silicon carbide substrate, wherein when the gate electrode is applied with a gate voltage, a current path is formed on only the first sidewall in the first and second sidewalk of each of the trenches and electric current flows in the current path, the surface of the silicon carbide semiconductor substrate has the off angle with respect to one of a (0001) plane and a (000-1) plane, the silicon carbide semiconductor substrate has an off direction in a <11-20> direction and the longitudinal direction of the trenches is a <1-100> direction that is perpendicular to the off direction, or the silicon carbide semiconductor substrate has an off direction in a <1-100> direction and the longitudinal direction of the trenches is a <11-20> direction that is perpendicular to the off direction, the first sidewall of the trench is at a first acute angle to one of a (11-20) plane and a (1-100) plane, the second sidewall of the trench is second acute angle to the one of the (11-20) plane and the (1-100) plane, and the first acute angle is smaller than the second acute angle, the contact layer is in contact with the second sidewall of each of the trenches, and the contact layer is a body layer extending along an entire depth of the second wall of each of the trenches and to a position deeper than a bottom of each of the trenches.

* * * * *